(12) United States Patent
Kim et al.

(10) Patent No.: US 12,218,114 B2
(45) Date of Patent: Feb. 4, 2025

(54) SEMICONDUCTOR DEVICE AND METHOD OF MAKING A PHOTONIC SEMICONDUCTOR PACKAGE

(71) Applicant: STATS ChipPAC Pte. Ltd., Singapore (SG)

(72) Inventors: KyungOe Kim, Incheon (KR); YoungCheol Kim, Gyeonggi-do (KR); HeeSoo Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 78 days.

(21) Appl. No.: 17/452,489

(22) Filed: Oct. 27, 2021

(65) Prior Publication Data
US 2023/0125546 A1   Apr. 27, 2023

(51) Int. Cl.
| | |
|---|---|
| *H01L 25/16* | (2023.01) |
| *H01L 21/56* | (2006.01) |
| *H01L 23/31* | (2006.01) |
| *H01L 23/498* | (2006.01) |
| *H01L 23/538* | (2006.01) |
| *H01L 31/12* | (2006.01) |

(52) U.S. Cl.
CPC ............ *H01L 25/167* (2013.01); *H01L 21/56* (2013.01); *H01L 23/3157* (2013.01); *H01L 23/49816* (2013.01); *H01L 23/49833* (2013.01); *H01L 23/5385* (2013.01); *H01L 31/12* (2013.01)

(58) Field of Classification Search
None
See application file for complete search history.

(56) References Cited

U.S. PATENT DOCUMENTS

| | | | |
|---|---|---|---|
| 7,989,707 B2 | 8/2011 | Yamano et al. | |
| 8,831,437 B2* | 9/2014 | Dobbelaere | H05K 999/99 398/139 |
| 10,181,458 B2 | 1/2019 | Shih et al. | |
| 2008/0013293 A1 | 1/2008 | Chen et al. | |
| 2014/0001652 A1* | 1/2014 | Chen | H01L 21/561 257/E23.141 |
| 2014/0037247 A1* | 2/2014 | Mathai | G02B 6/4206 385/52 |
| 2014/0321804 A1* | 10/2014 | Thacker | H01L 25/0655 385/14 |
| 2017/0097483 A1* | 4/2017 | Aoki | G02B 6/3851 |
| 2018/0138155 A1* | 5/2018 | Kim | H01L 25/0657 |
| 2018/0158768 A1* | 6/2018 | Kim | H01L 23/49811 |
| 2019/0131267 A1* | 5/2019 | Wang | H01L 23/49811 |
| 2020/0006088 A1* | 1/2020 | Yu | H01L 23/5386 |
| 2020/0168552 A1* | 5/2020 | Ha | H01L 24/20 |
| 2020/0279840 A1 | 9/2020 | Janta-Polczynski et al. | |
| 2021/0132310 A1* | 5/2021 | Yu | G02B 6/4243 |
| 2021/0305170 A1* | 9/2021 | Chuang | H01L 21/565 |
| 2022/0122921 A1* | 4/2022 | Choi | H01L 23/5386 |
| 2022/0196943 A1* | 6/2022 | Li | G02B 6/4243 |

* cited by examiner

*Primary Examiner* — Erik T. K. Peterson
*Assistant Examiner* — Christopher A. Schodde
(74) *Attorney, Agent, or Firm* — Brian M. Kaufman; Robert D. Atkins; PATENT LAW GROUP (57) ABSTRACT

A semiconductor device has an interposer. A first semiconductor die with a photonic portion is disposed over the interposer. The photonic portion extends outside a footprint of the interposer. The interposer and first semiconductor die are disposed over a substrate. An encapsulant is deposited between the interposer and substrate. The photonic portion remains exposed from the encapsulant.

13 Claims, 14 Drawing Sheets

SEMICONDUCTOR DEVICE AND METHOD OF MAKING A PHOTONIC SEMICONDUCTOR PACKAGE

FIELD OF THE INVENTION

The present invention relates in general to semiconductor devices and, more particularly, to a semiconductor device and method of making a photonic semiconductor package and method of forming the same.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Photonic semiconductor devices, which are capable of transmitting or receiving signals via light, are becoming more and more common. Inter-device transmission via light has many advantages over electrical signals, particularly the avoidance of losses due to wire resistance and reduction of the impact of electromagnetic interference (EMI). However, the options for packaging photonic semiconductor devices have heretofore been limited and unsatisfactory in many ways. Therefore, a need exists for an improved photonic semiconductor package.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
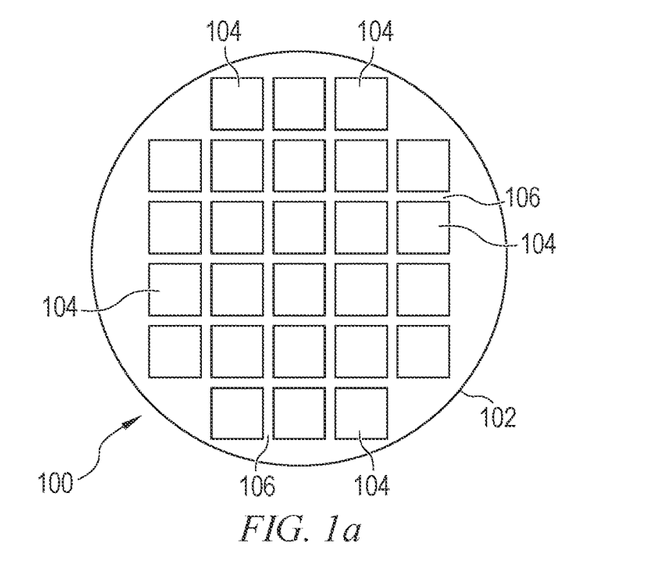
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
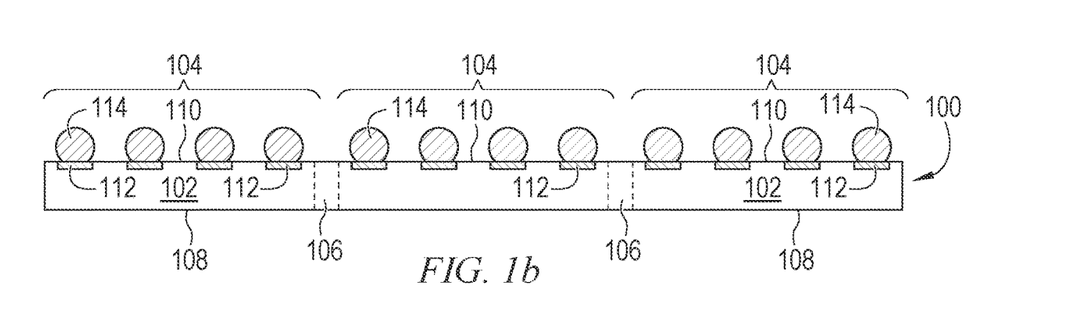

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating process, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1b. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bump, micro bump, conductive pillars, or other electrical interconnect.

Figure 1C:
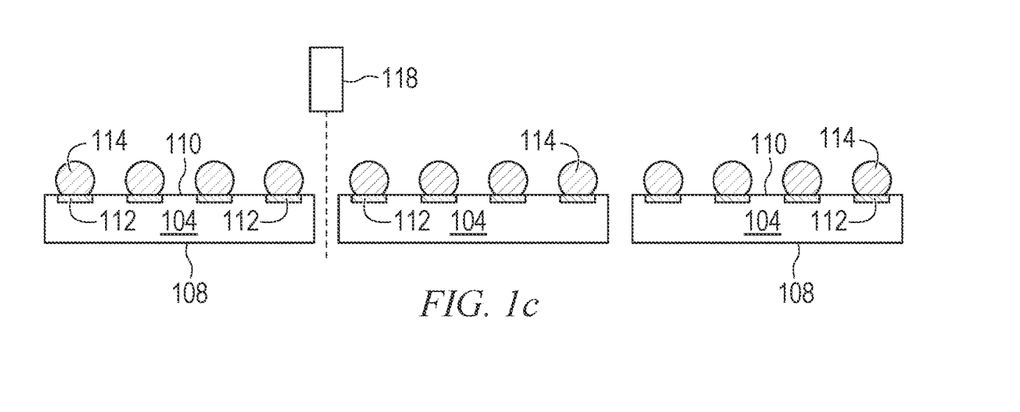

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post-singulation.

Figure 2A:
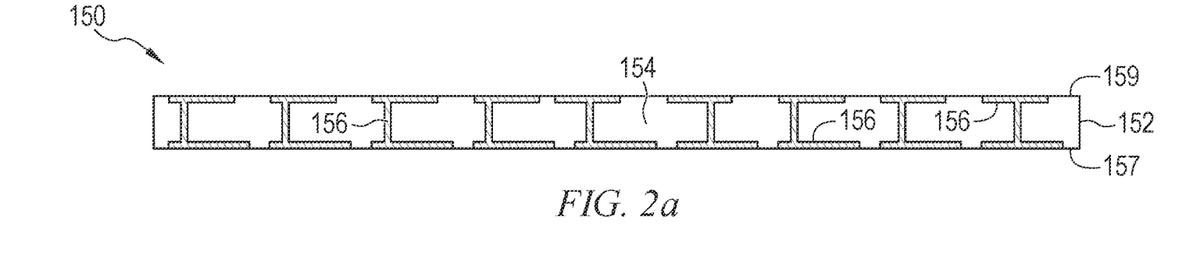
FIGS. 2a-2j illustrate formation of a photonic semiconductor package.

FIGS. 2a-2j illustrate forming photonic semiconductor packages 150 with semiconductor die 104. FIG. 2a is a partial cross-sectional view of a substrate or interposer 152. While only a single interposer 152 is shown, hundreds or thousands of interposers are commonly processed on a common carrier, using the same steps described herein for a single unit but performed en masse.

Interposer 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Interposer 152 can include any number of conductive and insulating layers interleaved over each other. A solder mask or passivation layer can be formed over either side of interposer 152. Any suitable type of interposer, substrate, or leadframe is used for interposer 152 in other embodiments.

Any components desired to implement the intended functionality of packages 150 are mounted to or disposed over interposer 152 and electrically connected to conductive layers 156. Interposer 152 has two major surfaces: top surface 157 and bottom surface 159. Components can be mounted onto top surface 157 and bottom surface 159 in any suitable order and configuration.

Figure 2B:
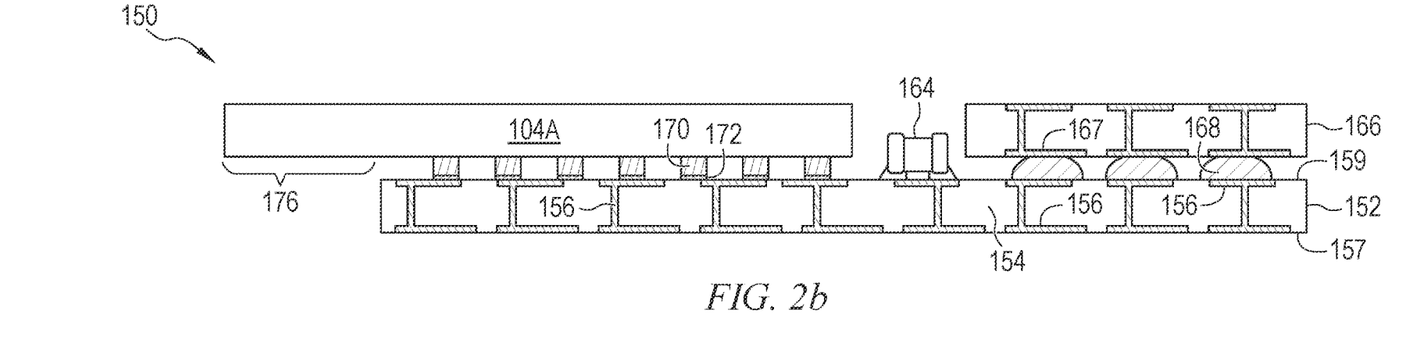

In FIG. 2b, manufacturing of package 150 commences with surface mounting of semiconductor die 104a, discrete component 164, and e-bar or PCB unit 166 on bottom surface 159. Bottom components are mounted first, but manufacturing could also proceed with components disposed on top surface 157 first. PCB unit 166 is a printed circuit board with a structure similar to interposer 152 or another type of interposer or substrate. Conductive layers 167 provide electrical paths through and across the surfaces of PCB unit 166. Solder bumps 168 are reflowed between conductive layers 167 and interposer 152 to mechanically and electrically connect PCB units 166 to interposer 152. Solder bumps 168 are formed similarly to bumps 114 above, and can be substituted with other types of interconnect structure as indicated above for bumps 114. In one embodiment, bumps 168 are formed by printing solder paste on interposer 157 or PCB unit 166 prior to disposing them together.

Semiconductor die 104a is structured and formed similarly to semiconductor die 104 above, but includes conductive pillars 170 as the interconnect structure instead of solder bumps 114. Conductive pillars 170 are formed by depositing a photolithography mask layer over wafer 100 and then forming openings in the mask wherever pillars 170 are desired. The openings are filled with copper or another suitable conductive material to form pillars 170, and then the mask is removed. A solder cap 172 is formed on each conductive pillar 170 using the same mask or by printing or dipping after removing the mask. Solder caps 172 are reflowed between conductive pillars 170 and conductive layer 156 to mechanically and electrically connect semiconductor die 104a to interposer 152. Solder bumps or other types of interconnect structures are used instead of conductive pillars 170 in other embodiments. Conductive pillars 170 do not collapse when solder caps 172 are reflowed like solder bumps 114 will, which provides a more consistent standoff between semiconductor die 104a and interposer 152.

Another specific detail regarding semiconductor die 104a that wasn't necessarily true of semiconductor die 104 is that semiconductor die 104a is a photonic integrated circuit (PIC). That is, semiconductor die 104a has the capability to transmit and/or receive light signals. At a later stage, a fiber optic or similar connector will be attached to photonic region 176 of semiconductor die 104a for connection of fiber optic cables to carry light signals to and from semiconductor die 104a. Semiconductor die 104a is cantilevered over the edge of interposer 152, i.e., photonic portion 176 of the semiconductor die extends outside of a footprint of the interposer. Thus, photonic region 176 remains available for later attachment of fiber optic hardware.

One or more discrete components 164, e.g., resistors, capacitors, inductors, transistors, or diodes, are mounted on bottom surface 159 using solder paste or another suitable attachment and connection mechanism. Solder paste is reflowed between terminals of discrete components 164 and contact pads of conductive layers 156 on bottom surface 159.

Figure 2C:
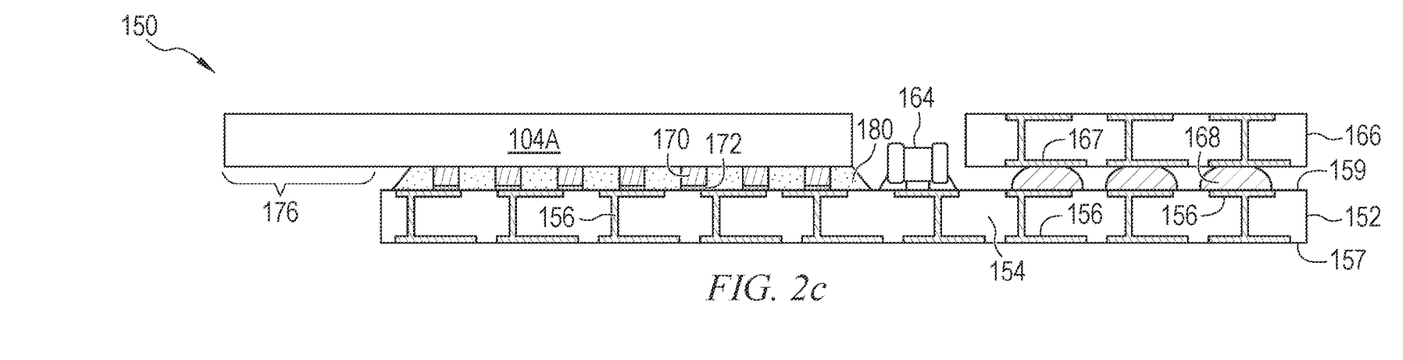

In FIG. 2c, a mold underfill (MUF) 180 is deposited between semiconductor die 104a and interposer 152, around conductive pillars 170. MUF 180 fills in gaps to structurally support the physical connection provided by solder caps 172. MUF 180 is deposited using capillary action in one embodiment. MUF 180 is cured after being deposited.

Figure 2D:
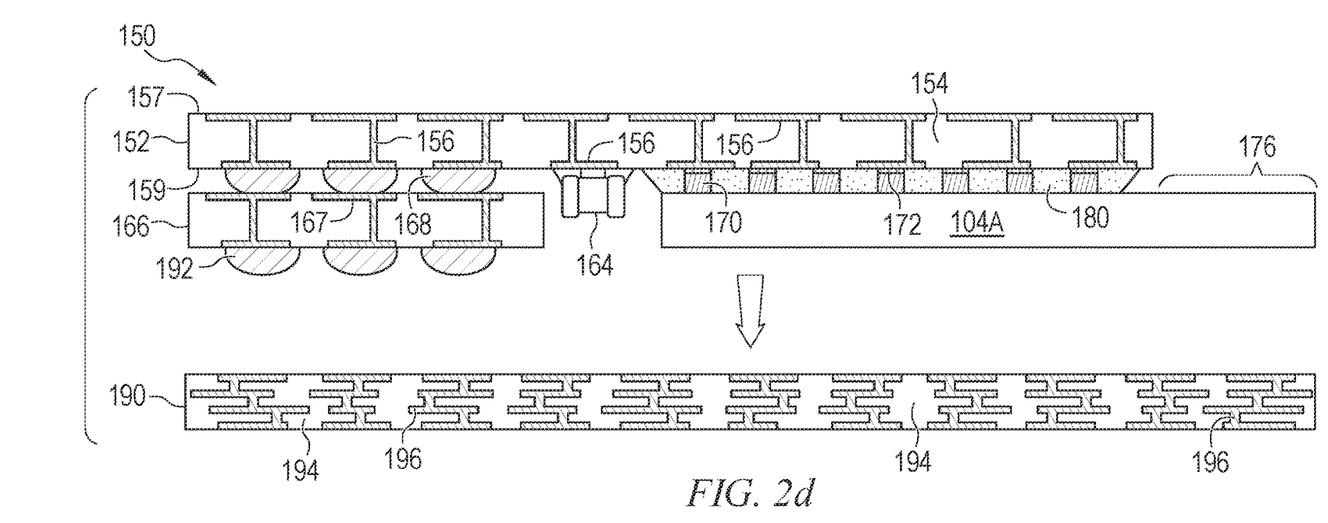
Figure 2E:
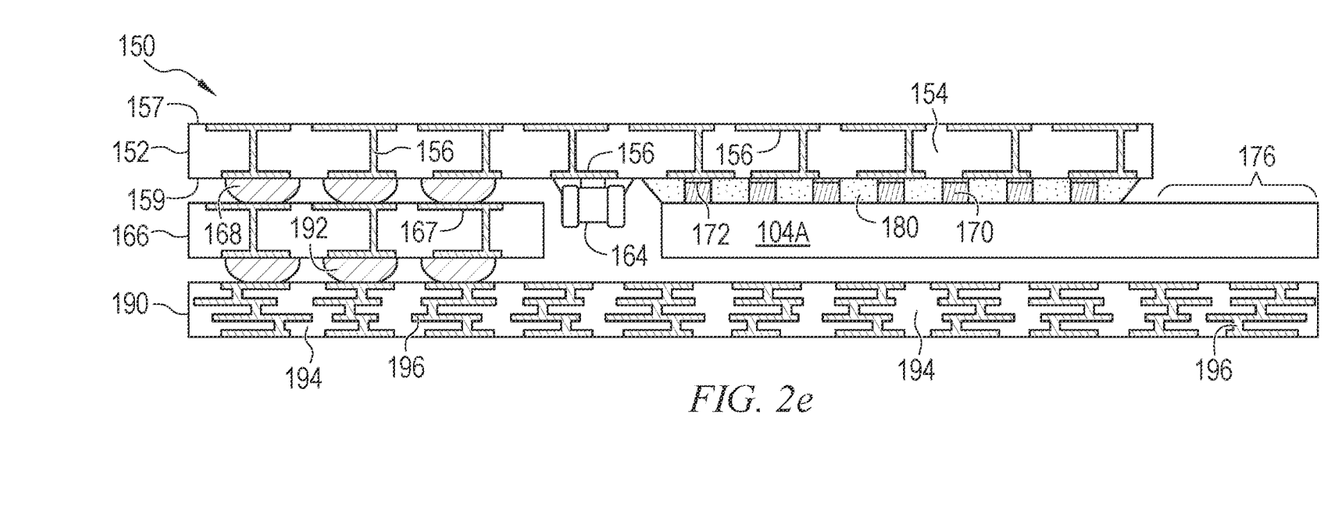

FIG. 2d shows interposer 152 with semiconductor die 104a, discrete components 164, and PCB unit 166 being flipped and then disposed over and mounted to a package substrate 190. Bumps 192 are added to PCB unit 166 prior to flipping and mounting interposer 152, or solder paste is printed onto the PCB unit or substrate 190. Bumps 192 are reflowed between PCB unit 166 and substrate 190 to physically and electrically connect the PCB unit to the substrate as shown in FIG. 2e. Substrate 190 is structured similarly to interposer 152 and PCB unit 166 with insulating layer 194 interleaved with conductive layers 196, but could also be any other type of package substrate or leadframe. Substrate 190 is electrically connected to discrete components 164 and semiconductor die 104a through PCB unit 166 and interposer 152. Additional electrical or semiconductor components can be mounted onto substrate 190 prior to attaching the interposer 152 assembly.

Figure 2F:
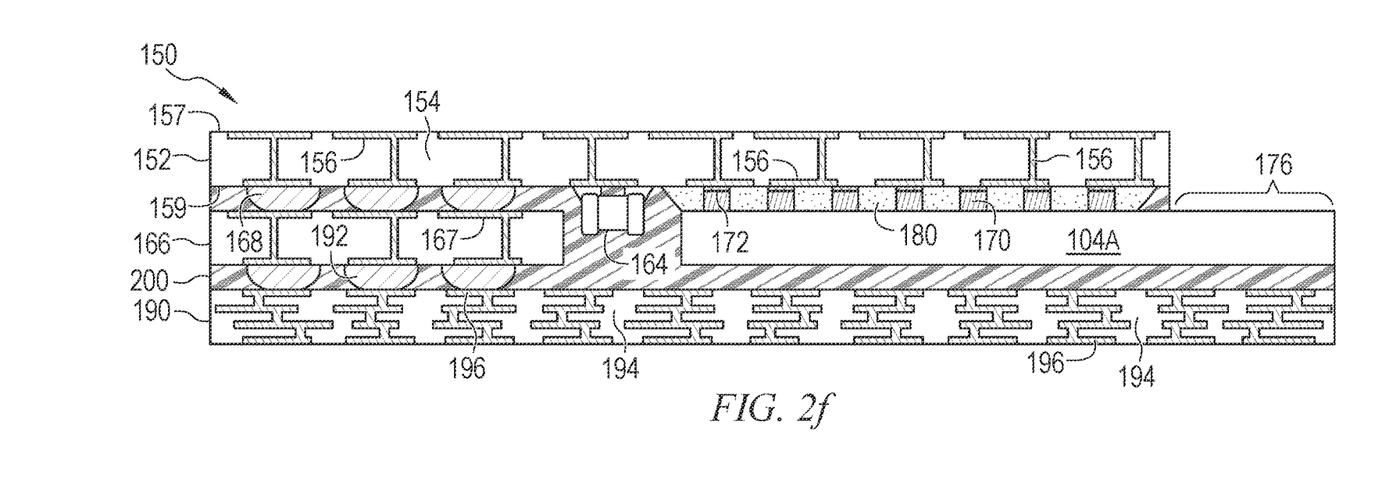

In FIG. 2f, an encapsulant or molding compound 200 is deposited between interposer 152 and substrate 190, covering top and bottom surfaces of PCB unit 166 and semiconductor die 104a except for photonic region 176 that remains exposed. Encapsulant 200 is an electrically insulating material deposited using a paste printing, compressive molding, transfer molding, liquid encapsulant molding, vacuum lamination, spin coating, or other suitable application process. Encapsulant 200 can be polymer composite material, such as an epoxy resin, epoxy acrylate, or polymer with or without a filler. Encapsulant 200 is non-conductive and environmentally protects the semiconductor device from external elements and contaminants.

Figure 2G:
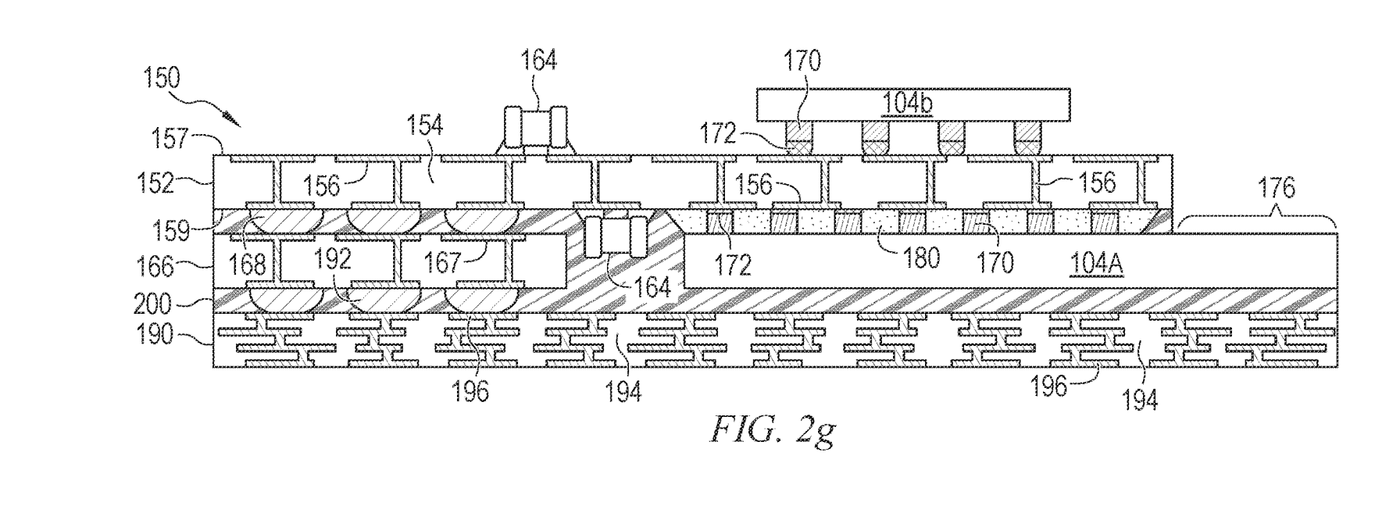
Figure 2H:
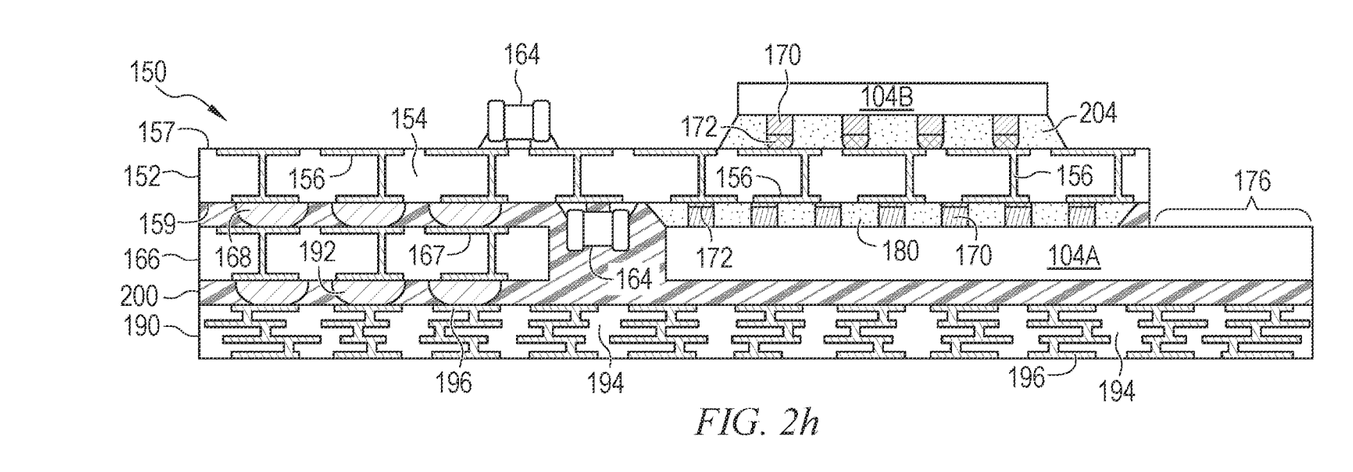

In FIG. 2g, any additional desired components, e.g., additional discrete components 164 and semiconductor die 104b, are mounted onto top surface 157 of interposer 152. Any desired combination of electrical components can be disposed on bottom surface 159 and top surface 157. Additional encapsulant can be deposited over top surface 157 to protect semiconductor die 104b if desired. In other embodiments, no electrical components are disposed on top surface 157. In FIG. 2h, MUF 204 is deposited under semiconductor die 104b as with MUF 180 under semiconductor die 104a.

Figure 2I:
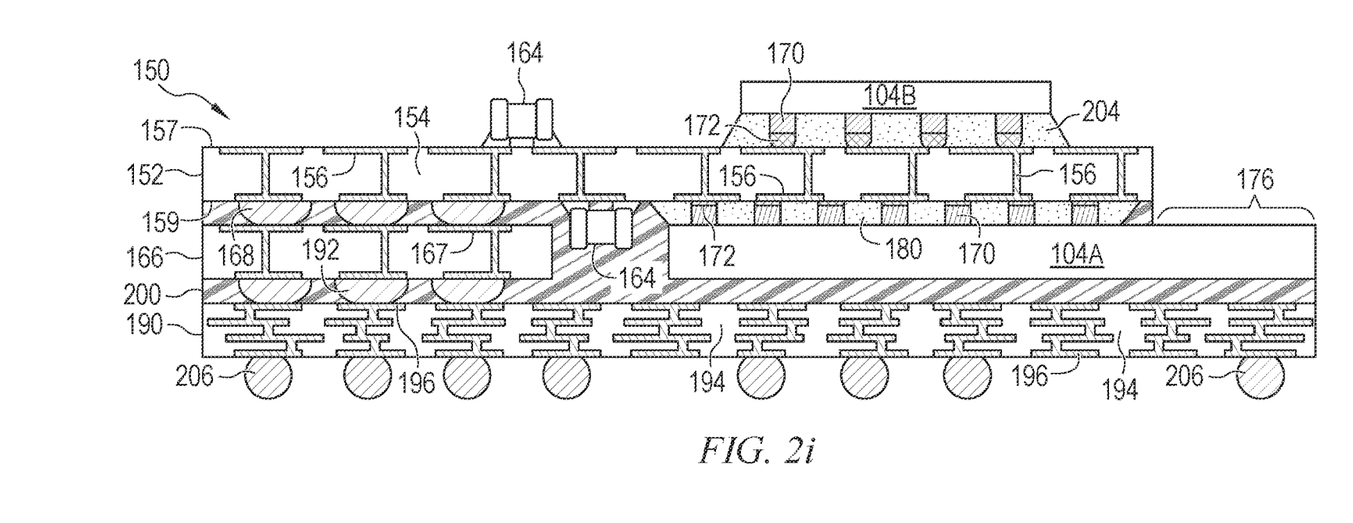

Package 150 is completed in FIG. 2i by applying solder bumps 206 to substrate 190 in any suitable method, similar to the application of bumps 114 in FIG. 1b. Bumps 190 are subsequently used to install package 150 into a larger electrical system. Other types of interconnect structure are used in other embodiments. Additional electrical or semiconductor components can be disposed on the bottom of substrate 190 between bumps 206 if desired. In some embodiments, a plurality of packages 150 is formed as a panel and then singulated from each other after completion.

Figure 2J:
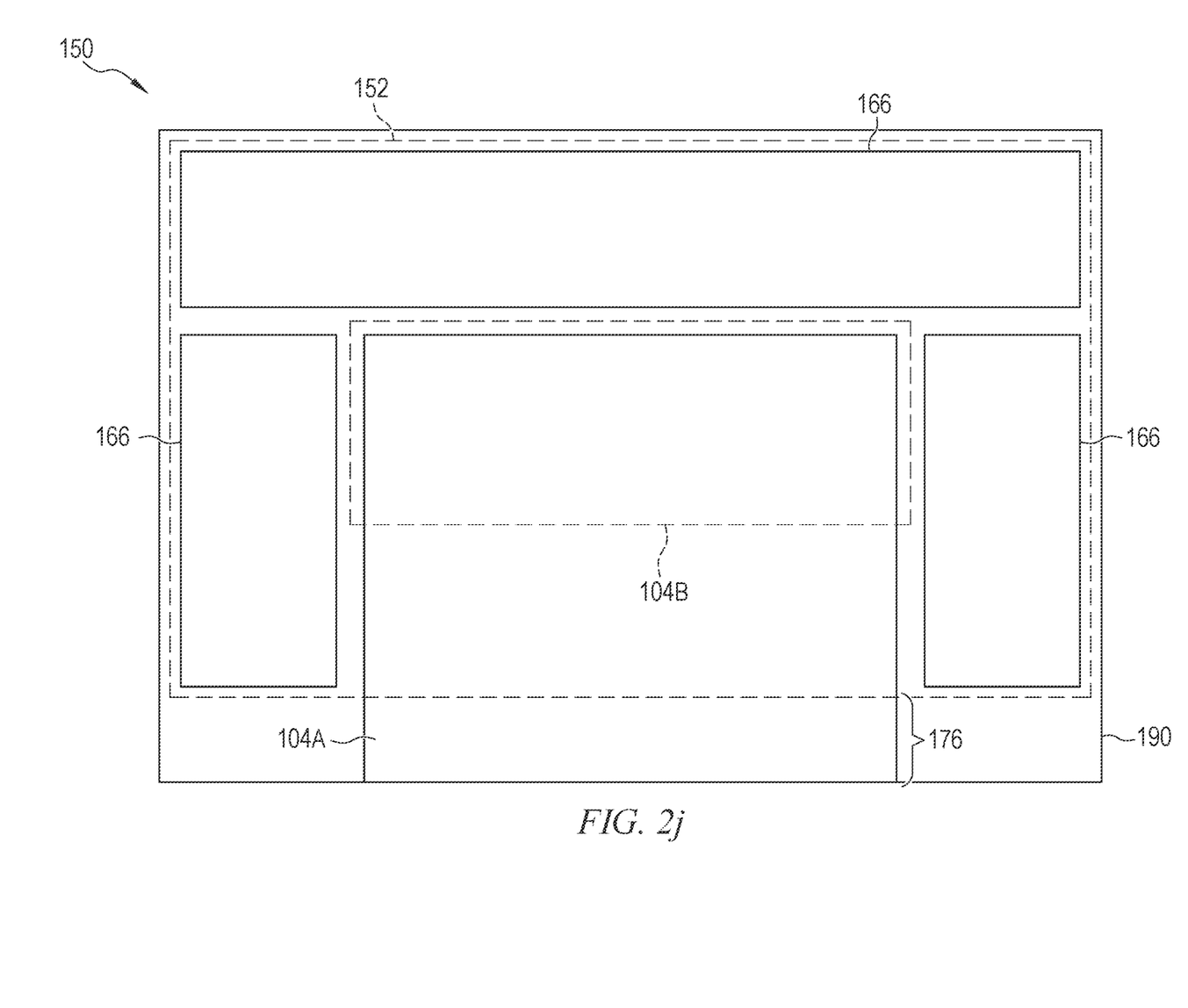

FIG. 2j shows a plan view of package 150. Photonic region 176 of semiconductor die 104a extends out from the footprint of interposer 152 to allow connection of fiber optic hardware. PCB units 166 are disposed around the other three sides of semiconductor die 104a where interposer 152 overlaps semiconductor die 104a. The layout of PCB units 166 can be different, e.g., only a single PCB unit on one side of semiconductor die 104a or an 'L'-shaped PCB unit that extends around multiple sides of semiconductor die 104a. Substrate 190 extends for the entire footprint of package 150, including under photonic region 176.

Package 150 is an advanced photonic system-in-package with multiple semiconductor die and discrete components. Photonic region 176 will have one or more fiber optic connectors attached using optical grade epoxy, or otherwise have hardware configure to send and receive optical signals. Photonic region 176 of semiconductor die 104a has a photodiode formed in its surface to receive an optical signal, a light emitting diode formed in its surface to emit an optical signal, or both. The fiber optic hardware attached to photonic region 176 will include a waveguide to guide light between fiber optic cables and semiconductor die 104a. The optical transmissions have improved characteristics relative to electrical transmissions as discussed above. The structure and method of making package 150 improves the capabilities available on a photonic package and make manufacturing easier and cheaper.

Figure 3A:
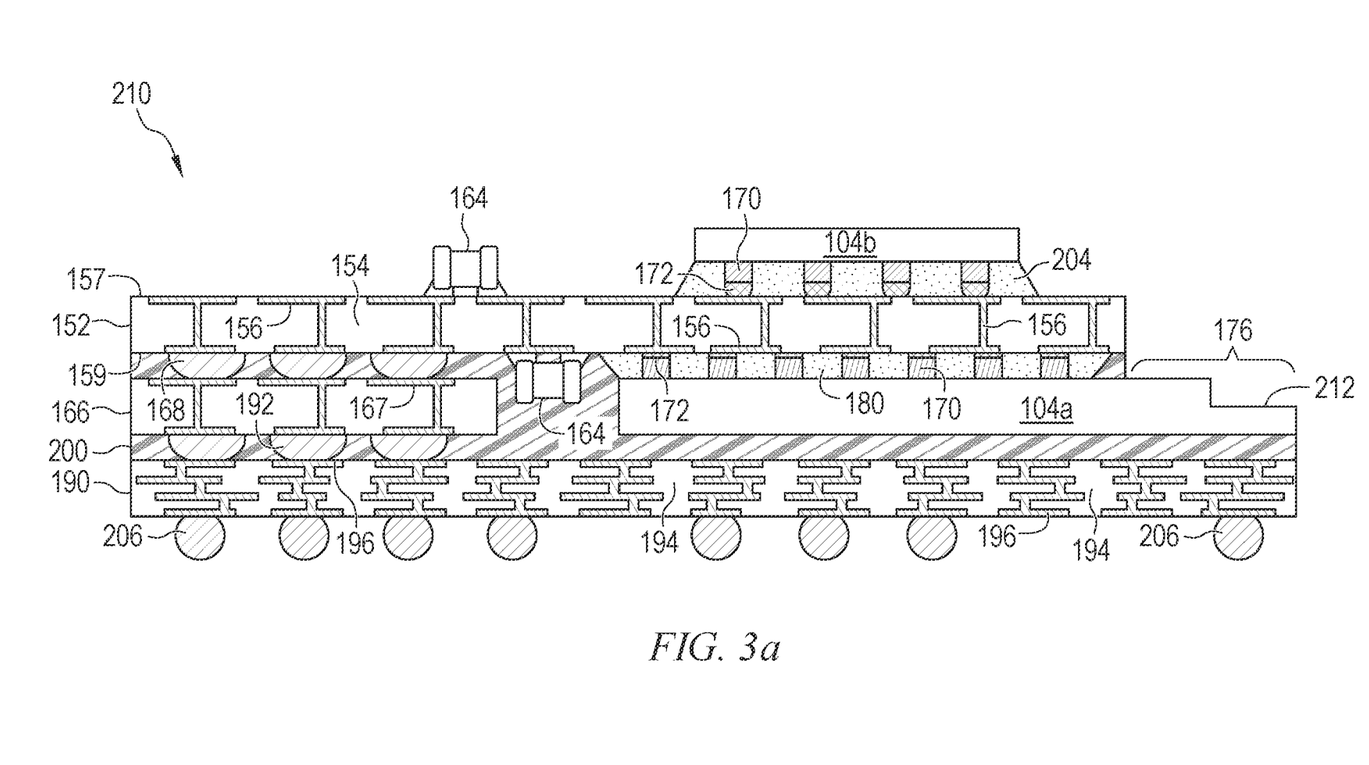
FIGS. 3a and 3b illustrate a notched embodiment.
Figure 3B:
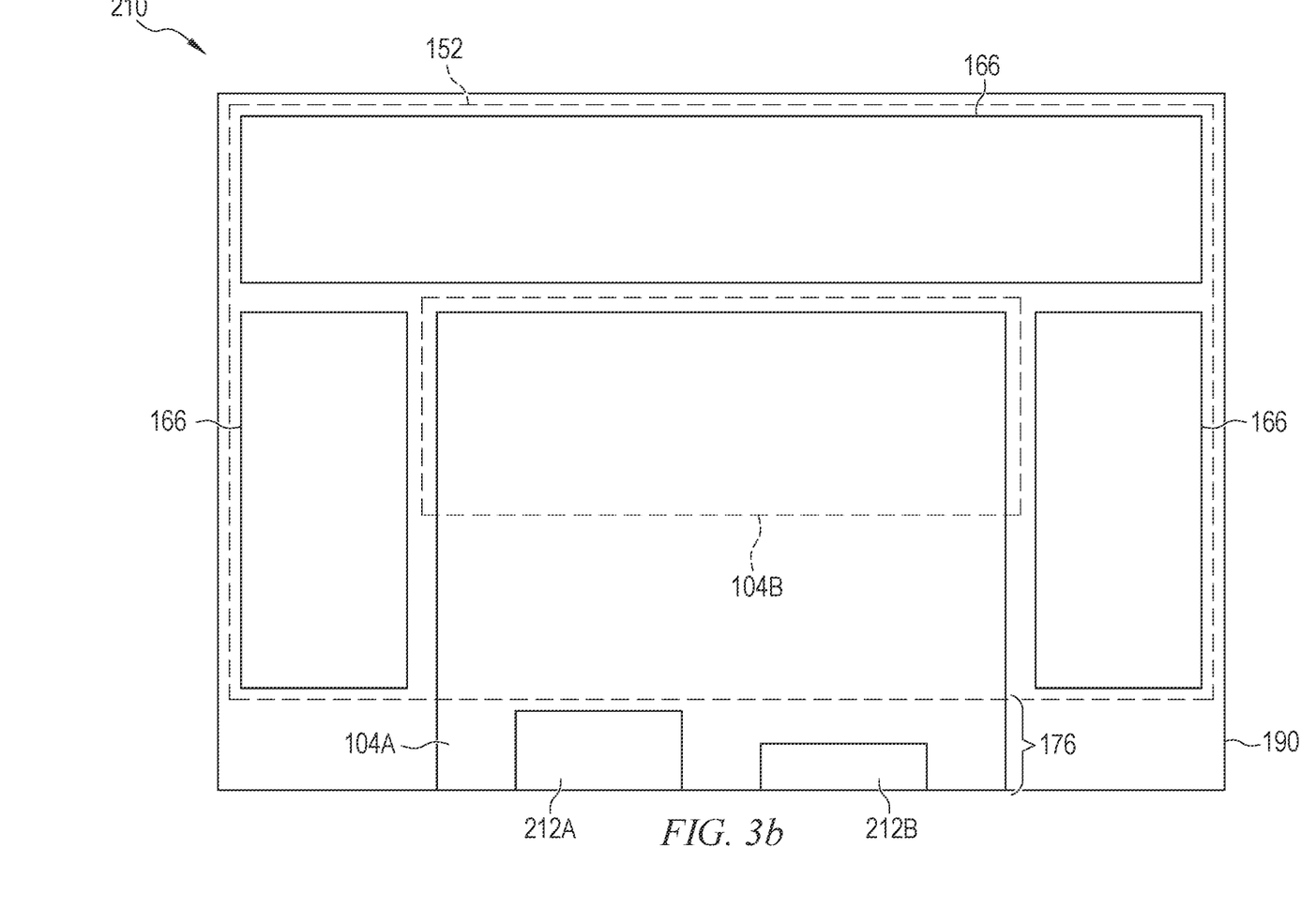

FIGS. 3a and 3b illustrate a package 210 formed similarly to package 150, except that semiconductor die 104a includes notches 212 formed within photonic region 176. Notches 212 operate as a physical guide for placement of optical ferrules during subsequent manufacturing. Ferrules are placed with tabs within notches 212 to ensure proper placement and alignment. A suitable optical epoxy is used to physically and optically connect the ferrules. The plan view in FIG. 3b shows two notches 212a and 212b are formed. Notch 212a is for an optical receiver and notch 212b is for an optical transmitter in one embodiment. Notches 212 are formed using a deep reactive-ion etching (DRIE), chemical etching, mechanical grinding, or another suitable process, either before or after assembly of package 210.

Figure 4A:
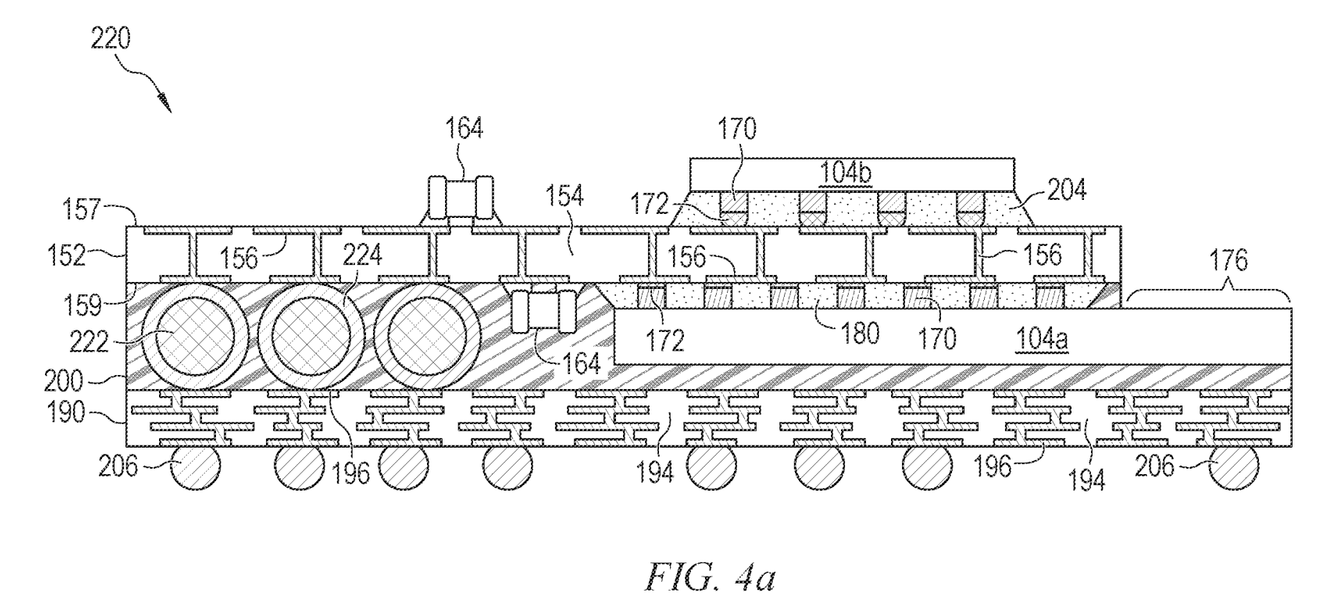
FIGS. 4a and 4b illustrate a copper-core solder ball interconnect option.
Figure 4B:
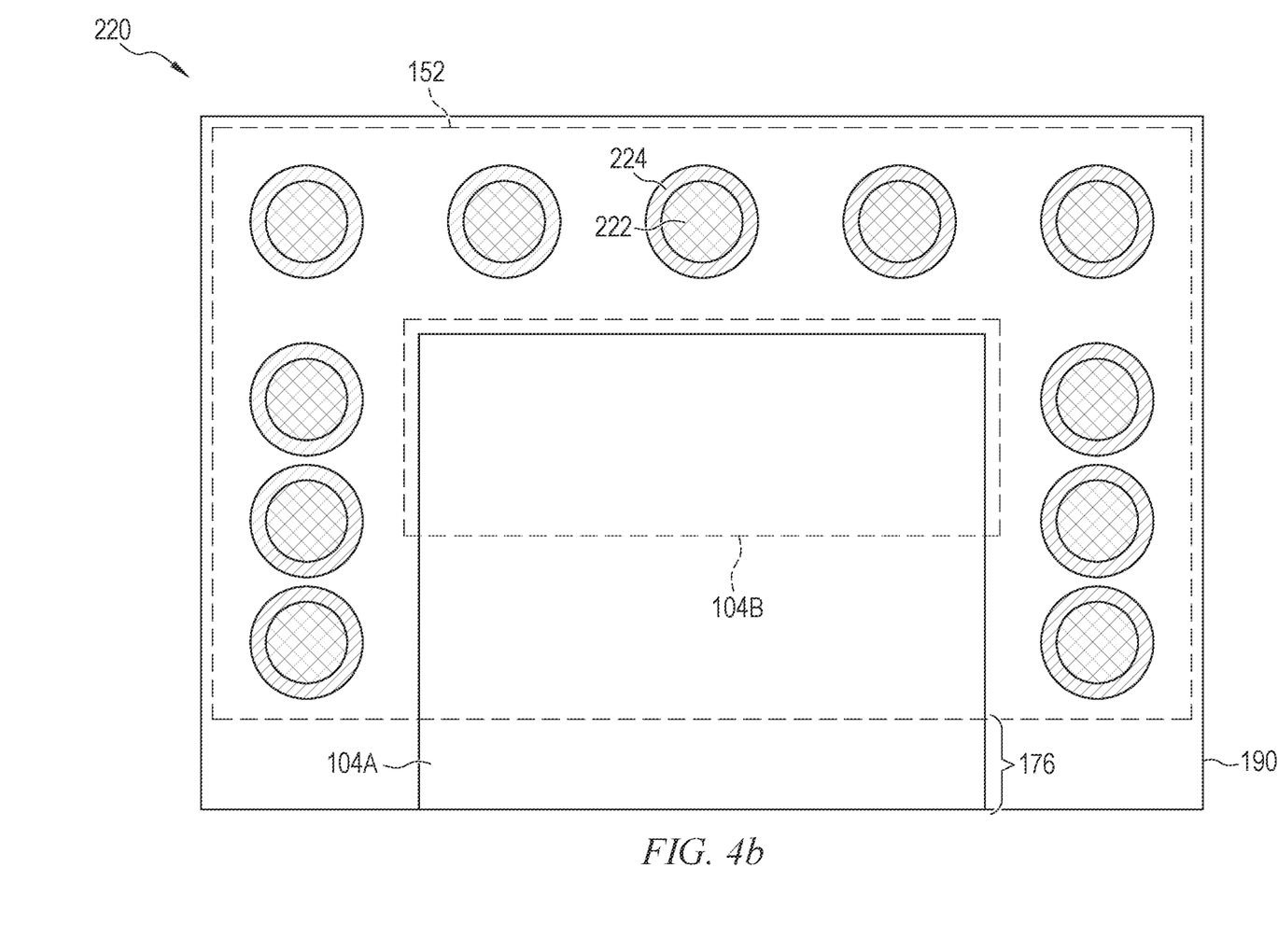

FIGS. 4a and 4b illustrate a package 220 with PCB unit 166 replaced by copper-core solder balls (CCSB) 222-224. CCSB include a copper core 222 surrounded by a solder coating 224. Copper core 222 can consist of any material with a higher reflow temperature than solder coating 224 so that the core physically supports interposer 152 over substrate 190 when the solder coating is reflowed. Core 222 provides a standoff height between the interposer and substrate. Using CCSB 222-224 instead of PCB unit 166 reduces processing steps because the PCB unit requires a step of printing solder onto both sides of the PCB unit or onto substrate 190 and interposer 152, which is not required with the CCSB due to being completely covered with solder to begin with. CCSB 222-224 electrically and physically connects interposer 152 to substrate 190.

Figure 5A:
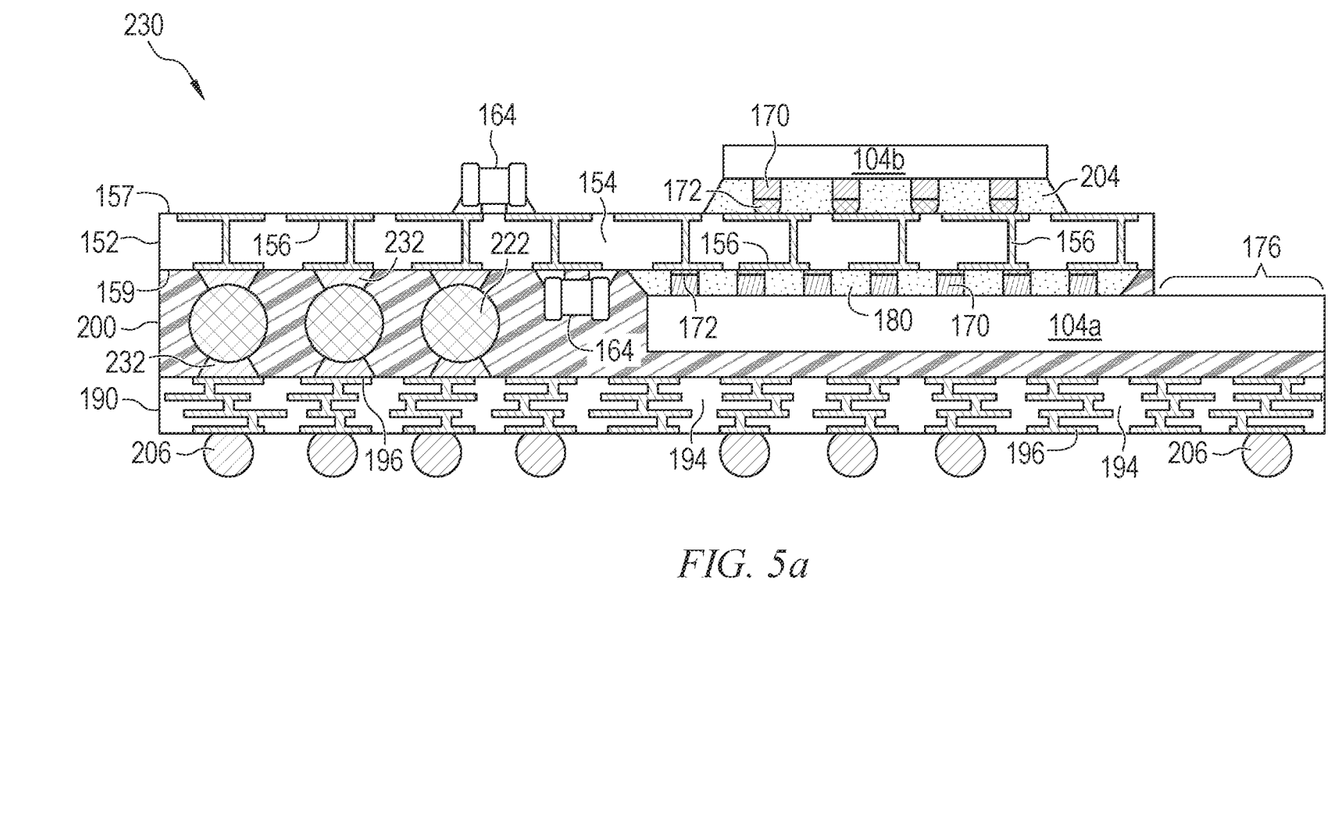
FIGS. 5a and 5b illustrate a copper ball interconnect option.
Figure 5B:
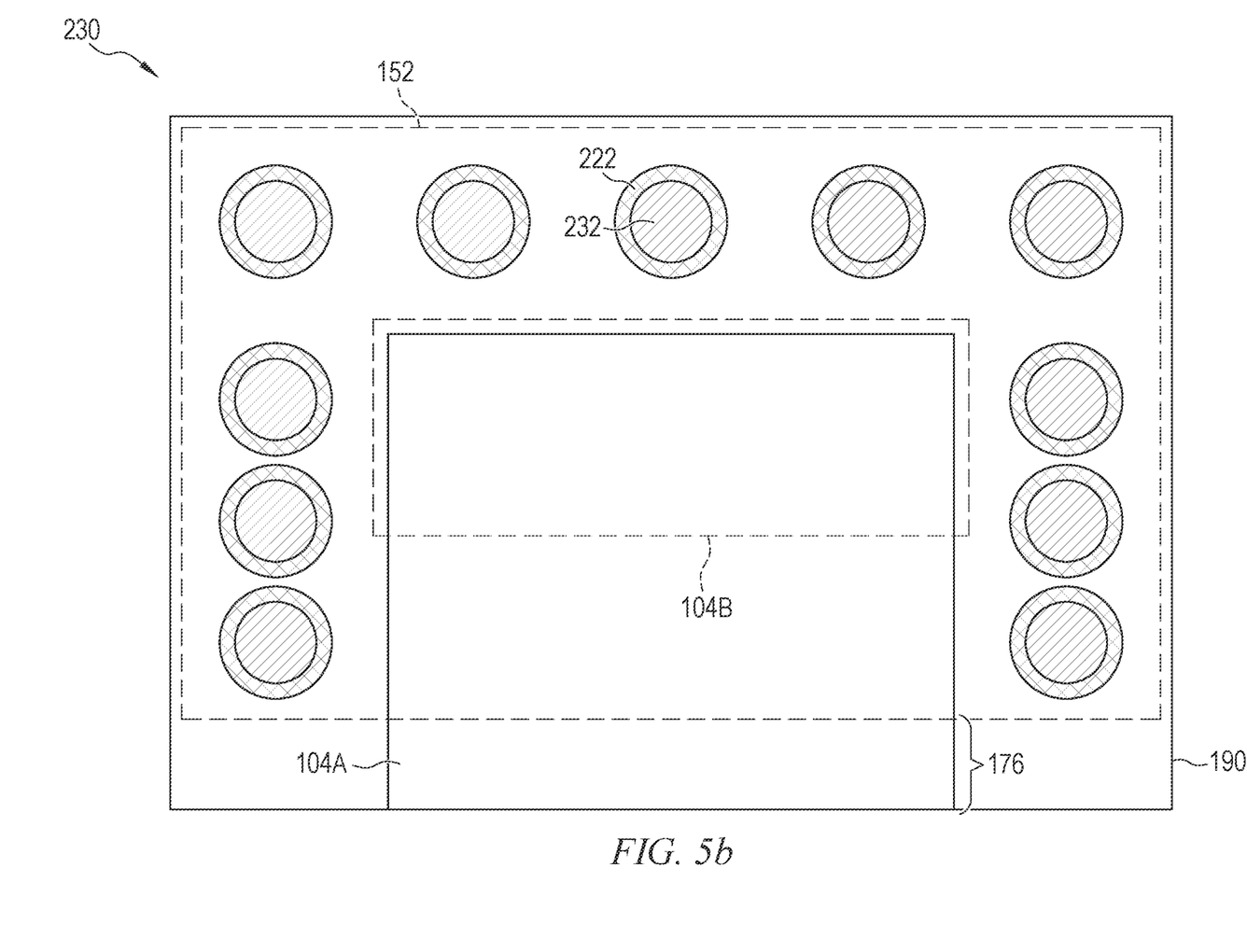

FIGS. 5a and 5b illustrate a package 230 that uses copper balls 222 as electrical interconnects and physical standoff without a solder coating. Solder paste 232 is printed onto interposer 152 and substrate 190 prior to assembly, and then reflowed onto copper balls 222.

Figure 6A:
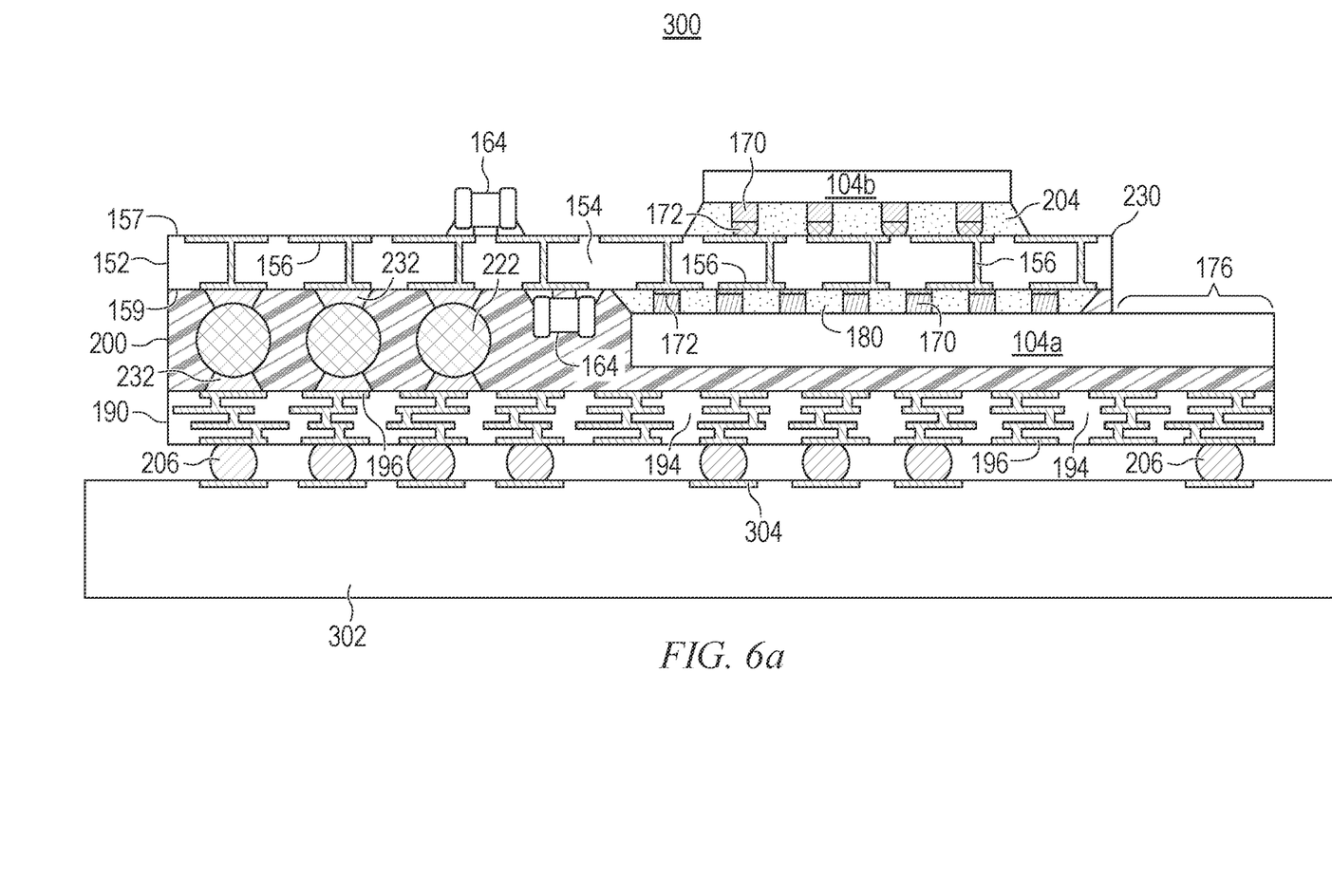
FIGS. 6a and 6b illustrate integrating the photonic semiconductor package into an electronic device.
Figure 6B:
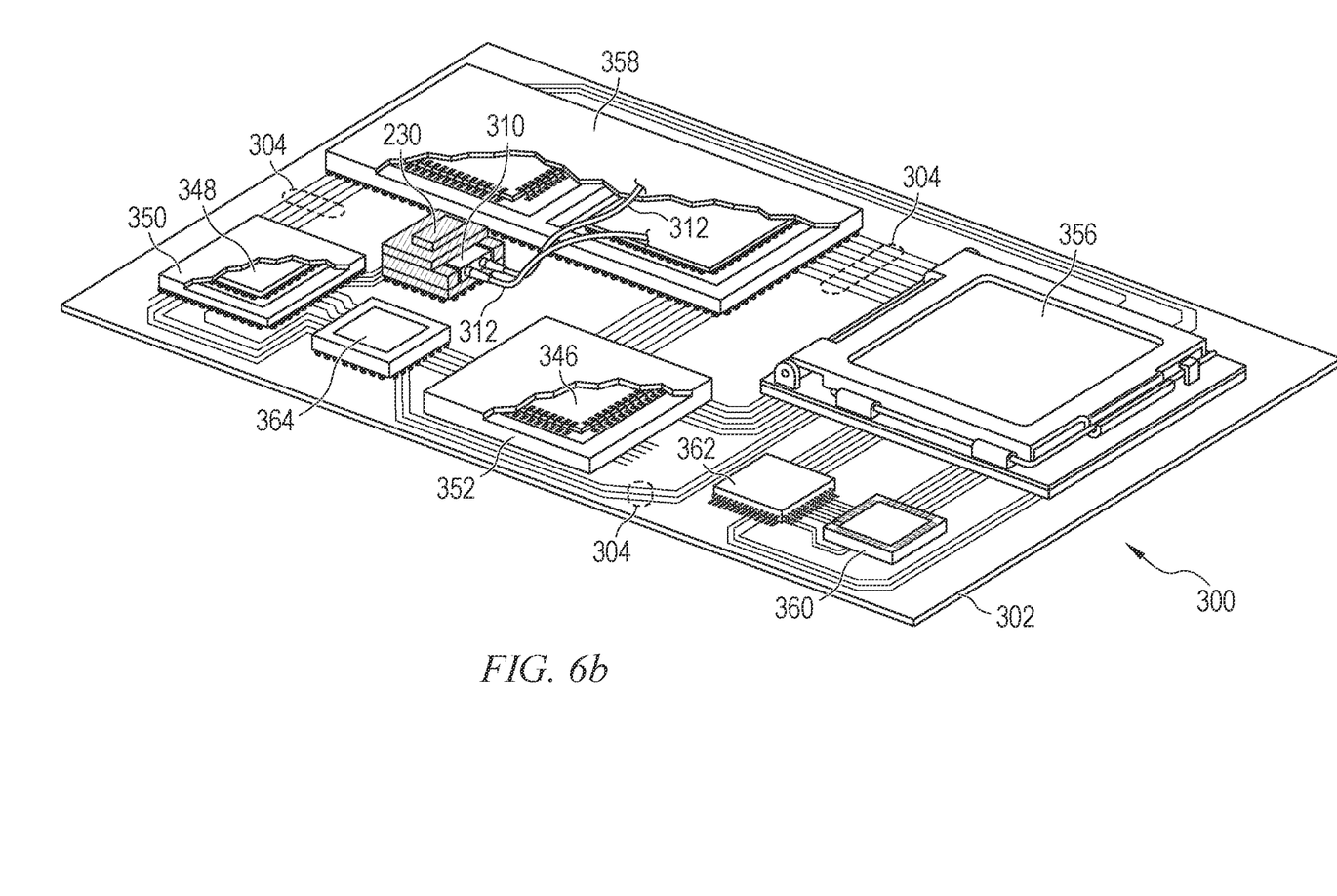

FIGS. 6a and 6b illustrate incorporating the above-described photonic semiconductor packages, e.g., package 230, into an electronic device 300. FIG. 6a illustrates a partial cross-section of package 230 mounted onto a printed circuit board (PCB) or other substrate 302 as part of electronic device 300. Bumps 206 are reflowed onto conductive layer 304 of PCB 302 to physically attach and electrically connect package 230 to the PCB. In other embodiments, thermocompression or other suitable attachment and connection methods are used. In some embodiments, an adhesive or underfill layer is used between package 230 and PCB 302. Semiconductor die 104 are electrically coupled to conductive layer 304 through interposer 152, copper balls 222, and substrate 190. One or more optical ferrules 310 or other optical hardware is mounted onto photonic region 176 of semiconductor die 104 as shown in FIG. 6b. Optical cables 312 are attached to ferrules 310 to transmit and receive optical signals.

FIG. 6b illustrates electronic device 300 including PCB 302 with a plurality of semiconductor packages mounted on a surface of the PCB, including package 230. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 6b, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with package 230. Conductive traces 304 electrically couple the various packages and components disposed on PCB 302 to package 230, giving use of the components within package 230 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing an interposer;
   disposing a first semiconductor die over the interposer with a portion of the first semiconductor die extending over a fourth edge of the interposer and outside a footprint of the interposer;
   disposing a first PCB unit over the interposer adjacent to a first edge of the first semiconductor die and between the first edge of the first semiconductor die and a first edge of the interposer in plan view;
   disposing a second PCB unit over the interposer adjacent to a second edge of the first semiconductor die and between the second edge of the first semiconductor die and a second edge of the interposer in plan view, wherein the second edge of the first semiconductor die is perpendicular to the first edge of the first semiconductor die;
   disposing a third PCB unit over the interposer adjacent to a third edge of the first semiconductor die and between the third edge of the first semiconductor die and a third edge of the interposer in plan view, wherein the first semiconductor die is directly between the first PCB unit and third PCB unit;
   disposing the interposer and first semiconductor die over a substrate with the first semiconductor die, first PCB unit, second PCB unit, and third PCB unit between the interposer and substrate;
   disposing a first solder bump between the interposer and first PCB unit; and
   disposing a second solder bump between the first PCB unit and substrate.

2. The method of claim 1, further including forming a notch in the portion of the first semiconductor die.

3. The method of claim 1, further including disposing a second semiconductor die over the interposer opposite the first semiconductor die.

4. The method of claim 1, further including disposing a solder bump over the substrate opposite the first semiconductor die.

5. A semiconductor device, comprising:
   an interposer;
   a first discrete passive component disposed on a first surface of the interposer;
   a first portion of solder extending from the first discrete passive component to a first contact pad of the interposer;
   a second discrete passive component disposed on a second surface of the interposer;
   a second portion of solder extending from the second discrete passive component to a second contact pad of the interposer;
   a first semiconductor die disposed over the first surface of the interposer with a photonic portion of the first semiconductor die extending outside a footprint of the interposer;
   a second semiconductor die disposed over the second surface of the interposer;
   a substrate disposed with the first semiconductor die between the interposer and substrate;
   a first PCB unit disposed between the substrate and interposer adjacent to a first edge of the first semiconductor die and between the first edge of the first semiconductor die and a first edge of the interposer in plan view, wherein the first discrete passive component is physically directly between the first PCB unit and the first semiconductor die;

a second PCB unit disposed between the substrate and interposer adjacent to a second edge of the first semiconductor die and between the second edge of the first semiconductor die and a second edge of the interposer in plan view, wherein the second edge of the first semiconductor die is perpendicular to the first edge of the first semiconductor die;

a third PCB unit disposed between the substrate and interposer adjacent to a third edge of the first semiconductor die and between the third edge of the first semiconductor die and a third edge of the interposer in plan view, wherein the first semiconductor die is directly between the first PCB unit and third PCB unit; and an encapsulant deposited between the interposer and substrate, wherein the encapsulant covers a first portion of a first surface of the first semiconductor die while a second portion of the first surface including the photonic portion remains exposed from the encapsulant.

6. The semiconductor device of claim 5, further including:
a transmit notch formed in the photonic portion of the first semiconductor die; and
a receive notch formed in the photonic portion of the first semiconductor die, wherein a first size of the receive notch is different from a second size of the transmit notch.

7. The semiconductor device of claim 5, further including:
a first gap between the first semiconductor die and first PCB unit;
a second gap between the first semiconductor die and second PCB unit; and
a third gap between the first semiconductor die and third PCB unit.

8. The semiconductor device of claim 7, further including:
a fourth gap between the first PCB unit and second PCB unit; and
a fifth gap between the second PCB unit and third PCB unit.

9. A semiconductor device, comprising:
an interposer;
a first semiconductor die disposed over the interposer with a portion of the first semiconductor die extending over a fourth edge of the interposer and outside a footprint of the interposer;

a first PCB unit disposed over the interposer adjacent to a first edge of the first semiconductor die and between the first edge of the first semiconductor die and a first edge of the interposer in plan view;

a second PCB unit disposed over the interposer adjacent to a second edge of the first semiconductor die and between the second edge of the first semiconductor die and a second edge of the interposer in plan view, wherein the second edge of the first semiconductor die is perpendicular to the first edge of the first semiconductor die;

a third PCB unit disposed over the interposer adjacent to a third edge of the first semiconductor die and between the third edge of the first semiconductor die and a third edge of the interposer in plan view, wherein the first semiconductor die is directly between the first PCB unit and third PCB unit;

a substrate disposed with the first semiconductor die, first PCB unit, second PCB unit, and third PCB unit between the interposer and substrate;

a first solder bump disposed between the interposer and first PCB unit; and a second solder bump disposed between the first PCB unit and substrate.

10. The semiconductor device of claim 9, further including a notch formed in the portion of the first semiconductor die.

11. The semiconductor device of claim 9, further including a second semiconductor die disposed over the interposer opposite the first semiconductor die.

12. The semiconductor device of claim 9, further including:
a first gap between the first semiconductor die and first PCB unit;
a second gap between the first semiconductor die and second PCB unit; and
a third gap between the first semiconductor die and third PCB unit.

13. The semiconductor device of claim 12, further including:
a fourth gap between the first PCB unit and second PCB unit; and
a fifth gap between the second PCB unit and third PCB unit.

* * * * *